United States Patent

[11] 3,593,064

[72] Inventors Horst Wagner
Eitra;
Horst Frohlich, Heringen/Werra; Rudolf Hoeppe, Unterhaun, all of, Germany
[21] Appl. No. 832,082
[22] Filed June 11, 1969
[45] Patented July 13, 1971
[73] Assignee Zuse K.G.
Bad Hersfeld, Germany
[32] Priority June 12, 1968
[33] Germany
[31] P 17 65 575.3

[54] ASSEMBLY FOR SUPPORTING AND ENCLOSING ELECTRICAL AND ELECTRONIC COMPONENTS
15 Claims, 6 Drawing Figs.

[52] U.S. Cl. .......... 317/100, 317/101
[51] Int. Cl. .......... H02b 1/00
[50] Field of Search .......... 317/100, 101, 101 CM, 101 D, 101 C

[56] References Cited
UNITED STATES PATENTS

| | | | |
|---|---|---|---|
| 3,141,998 | 7/1964 | Silkman | 317/100 |
| 3,264,326 | 8/1966 | Wiggerman | 317/101 |
| 3,267,333 | 8/1966 | Schultz | 317/100 |
| 3,459,998 | 8/1969 | Focarile | 317/100 |

*Primary Examiner*—David Smith, Jr.
*Attorney*—Michael S. Striker

ABSTRACT: Plug-in insulating boards which carry logical building blocks, conductors or like components are accommodated in sockets of stacked profiled rectangular metallic frames which form part of a composite enclosure for the boards. The frames are provided with external cooling fins and cooperate with each other or with the metallic lids of the enclosure to sealingly engage the marginal portions of the boards. The fasteners which separably connect the frames and the lids to each other extend at right angles to the plane of the boards. The plugs of adjoining boards are also separable from each other by moving the boards at right angles to their planes.

INVENTORS: HORST WAGNER
HORST FRÖHLICH, RUDOLF HOEPPE
BY
ATTORNEY

INVENTORS:
HORST WAGNER
HORST FROHLICH
RUDOLF HOEPPE

By: Michael S. Striker
Attorney

ASSEMBLY FOR SUPPORTING AND ENCLOSING ELECTRICAL AND ELECTRONIC COMPONENTS

BACKGROUND OF THE INVENTION

The present invention relates to an assembly for supporting and confining or enclosing electrical or electronic components, such as logical building blocks, conductors, plugs, capacitors, resistances or the like. More particularly, the invention relates to improvements in enclosures for so-called plug-in boards of insulating material which are utilized in computers or the like to support groups of electrical and/or electronic components.

It is already known to assemble two or more parallel plug-in boards in the form of a stack and to employ fasteners which extend at right angles to the planes of boards and establish a separable connection therebetween. For example, German DAS No. 1,059,988 discloses an assembly wherein the plug-in boards are disposed in parallel planes and are separated from each other by distancing elements which are interposed between the marginal portions of adjoining boards. The fasteners comprise screws which are normal to the planes of the boards and extend through the distancing elements. A drawback of such assemblies is that they cannot withstand substantial acceleration, i.e., the boards and/or the components thereon are likely to become displaced in response to sudden acceleration whereby the thus displaced components influence the electrical characteristics of the circuitry. Another drawback of such assemblies is that they do not provide a fluidtight enclosure for the plug-in boards, particularly for one or both outermost boards. Thus, if the boards are to be sealed against entry of gases or moisture, the assembly must be provided with a separate outer enclosure which contributes to initial cost and to the bulk of the resulting structure.

German DAS No. 1,138,440 discloses frames of insulating material each of which surrounds one of the plug-in boards. The adjoining frames are coupled to each other by means of tongue-and-groove connections. The electric terminals of the boards are accessible from the outside. A drawback of this proposal is that the insulating frames cannot shield the components on the boards so that, whenever shielding of components is desirable or necessary, the assembly must be provided with a separate outer housing of metallic material. The anchoring of components in desired position is achieved by filling the frames with a mass of hardenable synthetic plastic material. The hardened plastic material prevents uncontrolled displacement of components but it also prevents rapid dismantling for the purpose of inspection, replacement of components or repair.

SUMMARY OF THE INVENTION

An object of the present invention is to provide a novel and improved assembly of two or more plug-in boards for electrical and/or electronic components which is constructed and assembled in such a way that it can stand substantial mechanical stresses, that each plug-in board is readily accessible without the need for destruction of soldered or other permanent connections, the can conduct heat away from components in or on the boards, which shields the components against undesirable electrical influences, which can provide a liquid- and gasproof enclosure for the boards and their components, which can accommodate any desired practical number of boards, which can accommodate and properly enclose boards of different size and/or shape, and which is more compact than equivalent assemblies of presently known design.

Another object of the invention is to provide an assembly whose parts can be utilized to form assemblies for reception of larger or smaller numbers of boards, whose parts are interchangeable, which renders it possible to connect the components on the boards by resorting to relatively short conductors, and which insures more satisfactory dissipation of heat than presently known assemblies.

A further object of the invention is to provide a structure which can be assembled or taken apart by resorting to simple tools, which can be assembled or taken apart as often as desired, and which is composed of relatively simple, inexpensive and lightweight parts.

The improved assembly comprises a plurality of preferably parallel plug-in boards of phenol or other suitable insulating material each of which is arranged to support a plurality of logical building blocks, resistors, capacitors, conductors, plugs and/or other electrical or electronic components, a metallic enclosure for the boards including a stack of profiled frames each having socket means for the marginal portion of one of the boards, and fastener means separably securing the frames to each other. Thus, the enclosure performs the multiple function of serving as a direct support for the boards, as a preferably gas- and liquidproof housing for the boards and their components, and as a means for shielding the components on the boards against electrical or other influences. Still further, the frames and/or the lids of the enclosure may serve to support certain auxiliary parts, such as one or more external plugs, movable actuating members (e.g., knobs or the like), and/or indicating instruments.

The arrangement is preferably such that the socket means of each frame is formed in one of its end surfaces and that the other end surface of each frame abuts against the one end surface of the adjoining frame so that the marginal portions of plug-in boards are held against any movement relative to the frames when the fasteners are driven home. The external surfaces of the frames and/or lids are preferably designed to dissipate heat; for example, they may be provided with cooling ribs or fins.

The novel features which are considered as characteristic of the invention are set forth in particular in the appended claims. The which: assembly itself, however, both as to its construction and its mode of operation, together with additional features and advantages thereof, will be best understood upon perusal of the following detailed description of certain specific embodiments with reference to the accompanying drawing.

DESCRIPTION OF THE PREFERRED EMBODIMENTS

Figure 1:
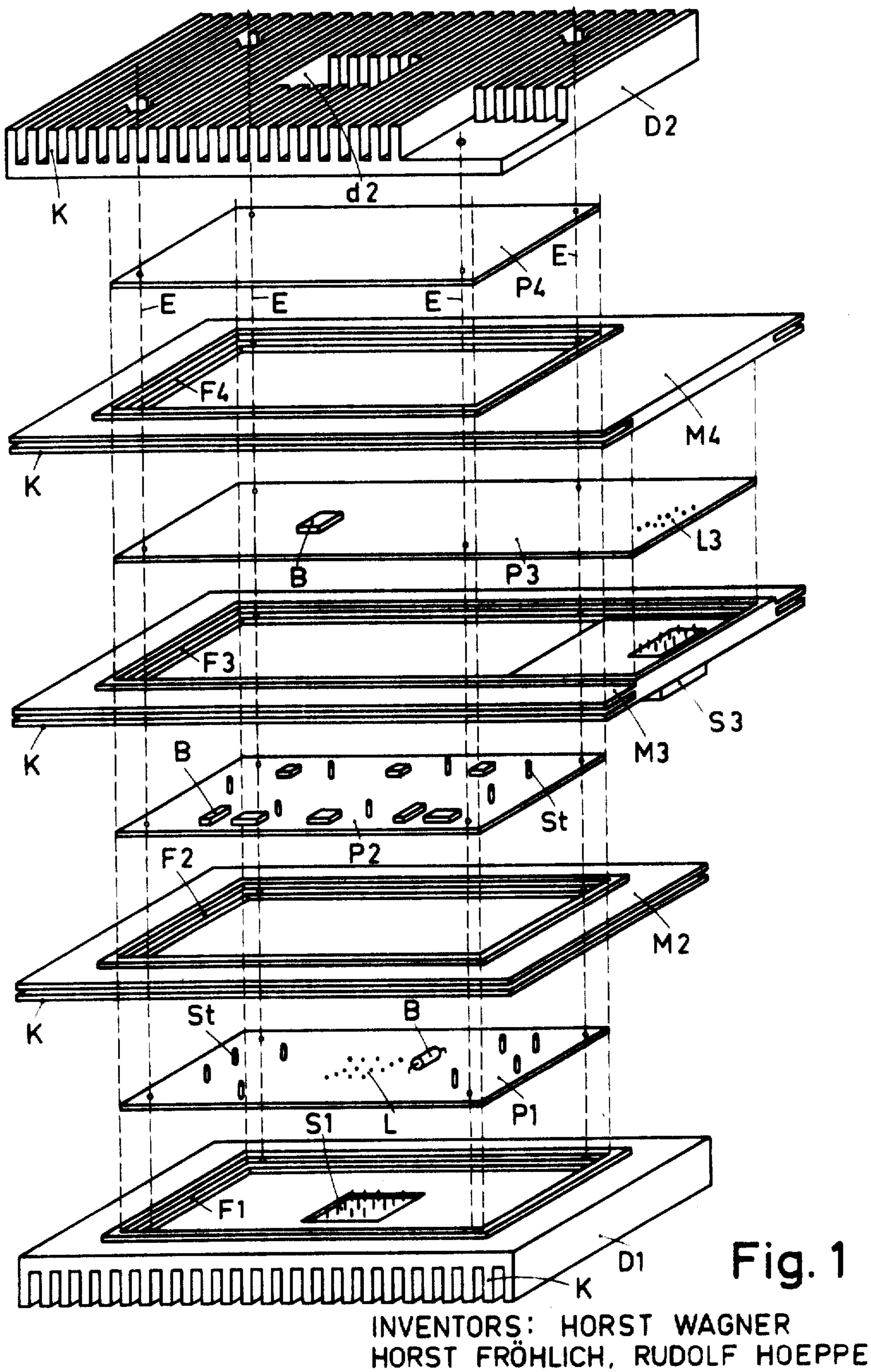
FIG. 1 is an exploded perspective view of an assembly which includes four plug-in boards and is constructed in accordance with one embodiment of the invention.

Referring first to FIG. 1, there is shown an assembly which includes four plug-in boards P1, P2, P3, P4 of insulating material, three profiled metallic frames M2, M3, M4 which are respectively designed to accommodate the boards P2, P3, P4, and two end plates or lids D1, D2. The lid D1 has a rectangular recess or socket F1 which accommodates the marginal portion of the board P1, and the lid D2 cooperates with the frame M4 to properly hold the marginal portion of the board P4 in the socket F4. The upper surface of the frame M2 is also formed with a rectangular recess or socket F2 which can receive the marginal portion of the board P2. A similar socket F3 is provided in the frame M2 for the marginal portion of the board P2. It is clear that, if desired or r.p.m. each board can be bolted, screwed means utilized in conjunction with a slotted or otherwise marked otherwise secured to the corresponding lid or frame. The fasteners (e.g., screws or bolts and nuts) which hold the assembly together are indicated by phantom lines, as at E. These fasteners extend at right angles to the planes of the boards P1— P4. When the boards P1—P4 are received in their respective sockets F1—F4 and the lid D2 is placed onto the frame M4 and the fasteners E are properly applied, the parts D1, D2, M2—M4 form a metallic enclosure or housing whose chambers completely surrounds and confines the boards P1—P4 and which shields the electrical and/or electronic components on these boards from rays and electricity. The dimensions of the enclosure, particularly its height, are a emitter-electrodes of the number of boards, i.e., a function of the number of frames. The minimum number of frames is one; the enclosure then includes the lids D1, D2 and one of the frames M2—M4. It be also possible to employ an enclosure which consists only of the lids D1, D2 with the board P1, P2, P3 or P4 placed into the socket F1 of the lid D1. The outer edge surfaces of the frames M2—M4 and the outer surfaces of the lids D1, D2 are uneven to enhance the dissipation of heat. In the illustrated embodiment, the unevennesses of such external surfaces are shown as cooling fins or ribs K. The ribs K on the frames M2—M4 extend circumferentially; they may but need not be circumferentially complete.

The boards P1—P4 carry groups of electrical and/or electronic components B and connectors or plugs St each of which preferably includes a male portion and a female portion. When the enclosure including the parts D1, M2—M4, D2 is properly assembled, the male portions of plugs St on the adjoining boards, and vice versa. Certain plugs St can be connected with outer or main plugs S1, S3 which are respectively provided in the lid D1 and frame M3. The pins of the outer plug S1 enter holes L of the adjoining board P1 and may extend into the female portions of sockets St on the board P2. The components B of adjoining boards are connected to each other by readily separable connections so that the assembly can be rapidly taken apart and reassembled without the need for separation or establishment of soldered or like permanent joints. For example, the components B on the board P2 can be separated from the components on the board P1 or P3 by moving one of the boards in axial direction of the fasteners E without necessitating destruction of a single soldered connection.

The frames M3, M4 are larger than the frame M2 and lids D1, D2. Also, the board P3 is larger than the boards P1, P2 and P4. In this way, the outer plug S3 of the frame M3 is accessible in fully assembled condition of the enclosure; the pins of this plug extend into the holes L3 of the terminal B. P3. It is further clear that one or more metallic frames can accommodate two discrete insulating boards, i.e., that a single socket can accommodate two boards end-to-end or side-by-side, or that at least one of the frames may include two or more discrete sockets, one for each board. Otherwise stated, at least one of the boards P1—P4 may consist of two or more discrete sections. For example, the frames M3, M4 can be extended in a direction to the right, as viewed in FIG. 1, to such an extent that the frame M3 may be formed with a second socket (not shown) for a further board which is overlapped and sealed from the atmosphere by the adjoining portion of the frame M4. The length and/or width of the frames depends on the dimensions of the corresponding board or boards; thus, the height and/or the transverse dimensions of the enclosure depend exclusively on the desired number and size of boards. This enables the designer to assemble any desired number of boards of desired size in a metallic enclosure whose dimensions exceed only little the dimensions of the stack of boards.

Figure 2:
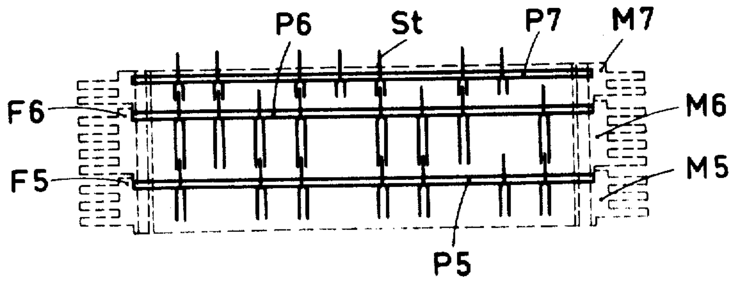
FIG. 2 is a fragmentary sectional view of a second assembly which comprises frames of different height.

FIG. 2 illustrates a portion of an assembly which includes metallic frames M5, M6, M7 for plug-in boards P5, P6, P7. The distance between the median board P6 and outer board P5 exceeds the distance between the board P6 and outer board P7. This illustration further shows the manner in which certain plugs St of the boards P5—P7 engage with each other when the corresponding metallic frames are properly stacked on top of each other. The frames M6, M7 can be provided with male projections of rectangular outline designed to fit into the sockets F5, F6 of the frames M5, M6 so that the marginal portions of the boards P5, P6 are then clamped between the adjoining end surfaces of the frames M5—M6 and M6—M7. The fasteners (not shown in FIG. 2) press the end surfaces of frames M5—M7 against each other in a direction at right angles to the planes of the boards P5—P7 to insure that the assembly exhibits very satisfactory mechanical stability as well as that the boards are preferably sealed from the surrounding atmosphere.

Figure 3:
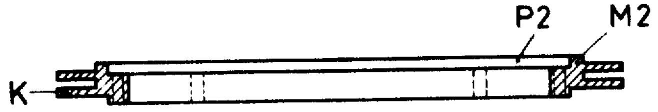
FIG. 3 is a fragmentary sectional view of a portion of the assembly shown in FIG. 1.
Figure 4:
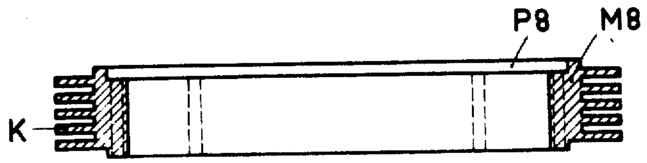
FIG. 4 is a similar fragmentary sectional view of an assembly which includes a frame of substantial height.

FIG. 3 shows that the metallic frame M2 for the board P2 is rather flat; it is formed with only two circumferentially extending cooling or heat dissipating ribs K. The metallic frame M8 for the board P8 of FIG. 4 is of greater height; this is desirable if the board (not shown) which is adjacent to the lower end surface of the frame M8 carries components B whose height is such that they would be engaged by the board P8 were the frame M8 replaced by a frame (e.g., M2) of lesser height.

Figure 5:
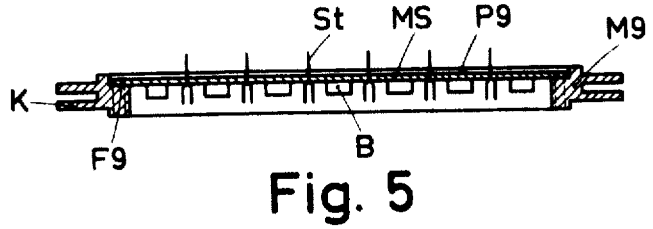
FIG. 5 is a fragmentary sectional view of an assembly wherein at least one of the plug-in boards is provided with at least one liner of heat-conducting material.

The board P9 of FIG. 5 is received in of socket F9 of a metallic frame M9. The underside of the board P9 is provided with a liner or layers MS of metallic material (e.g., a layer of copper) whose purpose is to conduct heat from the components B on the board P9 to the ribs K on the frame M9. It is clear that both sides of the board P9 can be provided with liners of copper or with liners of any other material having good heat conducting characteristics. Another function of the liner or liners MS is to shield the components B on the board P9 from components on the adjoining board or boards, not shown. Still further, the marginal portions of the liner or liners MS serve as sealing elements or gaskets to insure airtight and liquidtight sealing of the adjoining portions of the board P9 when the latter is properly clamped between two frames or between a frame and a lid.

Figure 6:
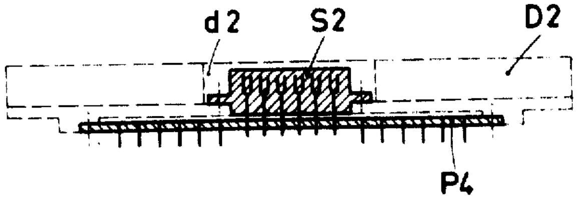
FIG. 6 is a sectional view of a lid in the enclosure of the assembly shown in FIG. 1.

FIG. 6 is a sectional view of the lid D2. This lid has a window or opening *d2* for an outer plug S2 whose pins engage with the female portions of plugs on the adjoining board P4.

An important advantage of the improved assembly is its 58, satisfactory mechanical stability. This is due to the fact that the frames M consist of metallic material and are directly connected to each other by screws, bolts or analogous reliable fasteners. The enclosure including the frames and the lids shields the components B against electrical influences and it can also form a gas- and liquidtight chamber for the boards P. Thus, a single enclosure suffices to serve as a means for directly of the boards, as a means for shielding the components, and as a means for providing a fluidtight seal. Moreover, the frames can be assembled in any desired number or sequence, depending on the configuration of components on the respective boards, and the dimensions of the assembled enclosure reflect the number and size of plug-in boards therein. Still another advantage of the assembly is that each of its lids performs several functions, i.e., the lid D1 serves as a frame for the adjoining board P1 and the other lid D2 cooperates with of adjoining frame M4 to hold the corresponding board P4 against and with reference to its socket F4. It is clear that at least one of the lids can support other auxiliary parts, i.e., not only the plug S1 or S2 but also a movable actuating knob, an indicating instrument or the like.

Without further analysis, the foregoing will so fully reveal the gist of the present invention that others can, by applying current knowledge, readily adapt it for various applications without omitting features which fairly constitute essential characteristics of the generic and specific aspects of the above-described contribution to the art.

What I claim as new and desire to be protected by Letters Patent is set forth in the appended claims:

1. An assembly for accommodation of logical building blocks or other electrical and/or electronic components comprising a plurality of plug-in boards, each arranged to carry a group of components; a liner of heat-conductive material applied to at least one side of at least such boards which carry heat-producing components; a metallic enclosure for said boards including a stack of abutting metallic frames and a pair of metallic lids respectively abutting with one side against the frames on opposite ends of said stack, each of said frames being formed at one side thereof with socket means providing an inner peripheral shoulder in said frame and on the other side with a peripheral projection fitting in the socket means of the adjacent frame and one of said pair of lids being provided on said one side thereof with such a socket means and the other with such a projection, said plug-in boards and said metallic liners thereon being respectively located in said socket means so that peripheral portions of said boards and liners are tightly held between said shoulders and projections whereby heat developed by components on said boards is transferred from said liners by direct heat convection to said metallic enclosure; and fastener means separably securing said frames and lids to each other.

2. An assembly as defined in claim 1, wherein said boards are located in substantially parallel planes and wherein said fastener means extends substantially at right angles to such planes.

3. An assembly as defined in claim 2, wherein said frames include a first and a second frame and wherein the height of said first frame, as considered at right angles to said planes, exceeds the height of said second frame.

4. An assembly as defined in claim 1, wherein said frames include at least one larger frame and at least one smaller frame.

5. An assembly as defined in claim 1, wherein at least one of said boards includes a plurality of discrete sections.

6. An assembly as defined in claim 1, and further comprising sealing means interposed between abutting surfaces of said frames.

7. An assembly as defined in claim 6, wherein said enclosure defines a fluidtight chamber for said boards.

8. An assembly as defined in claim 1, further comprising connector means separably connecting said boards to each other.

9. An assembly as defined in claim 8, wherein said connector means comprises electric plugs having interengaging male and female portions, said male portions being separable from the respective female portions in response to movement in a direction at right angles to the planes of said boards.

10. An assembly as defined in claim 1, wherein said frames are provided with heat-dissipating external surfaces.

11. An assembly as defined in claim 10, wherein said heat-dissipating surfaces are ribbed.

12. An assembly as defined in claim 1, said enclosure further comprises at least one metallic lid cooperating with one of said frames to hold the corresponding board against movement with reference to the respective socket means, and further comprising an auxiliary part mounted on at least one lid.

13. An assembly as defined in claim 12, wherein said auxiliary part is an electric plug.

14. An assembly as defined in claim 1, wherein said boards and said frames are of rectangular outline and wherein each of said frames has a first surface provided with the respective socket means and a second surface abutting against the first surface of the adjoining frame.

15. An assembly as defined in claim 1, wherein said boards are located in substantially parallel planes and include at least one its board and two outer boards, the distance between said median board and one of said outer boards exceeding the distance between said median board and the other outer board.